United States Patent
Zeng

(10) Patent No.: US 7,639,276 B2
(45) Date of Patent: Dec. 29, 2009

(54) SIMULATION SYSTEM AND METHOD FOR TESTING PERFORMANCES OF TV TUNERS

(75) Inventor: Peng Zeng, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 795 days.

(21) Appl. No.: 11/308,759

(22) Filed: Apr. 28, 2006

(65) Prior Publication Data

US 2006/0268113 A1   Nov. 30, 2006

(30) Foreign Application Priority Data

May 29, 2005   (CN) .................... 2005 1 0034985

(51) Int. Cl.
*H04N 17/00* (2006.01)
(52) U.S. Cl. ..................... 348/180; 348/184
(58) Field of Classification Search .......... 348/180, 348/184, 181, 189, 552, 725, 731–733; 703/21; 702/69; H04N 17/00, 7/00, 5/44, 5/50
See application file for complete search history.

(56) References Cited

U.S. PATENT DOCUMENTS

| | | | | |
|---|---|---|---|---|
| 6,202,212 | B1 * | 3/2001 | Sturgeon et al. | 348/552 |
| 6,577,353 | B1 * | 6/2003 | Welles et al. | 348/725 |
| 2003/0112380 | A1 | 6/2003 | Lee et al. | |
| 2004/0017519 | A1 | 1/2004 | Sung | |

* cited by examiner

*Primary Examiner*—Sherrie Hsia
(74) *Attorney, Agent, or Firm*—Wei Te Chung

(57) ABSTRACT

A simulation system for testing performances of television (TV) tuners (50) attached to a plurality of computers (5) is disclosed. The system includes: a plurality of players (1), each for transmitting an original signal comprising audio and video data formatted in a corresponding data format; a plurality of frequency adjusters (2), each for receiving a corresponding original signal from one of the players and changing the original signal into an adjusted signal having a fixed frequency; at least one frequency mixer (3) for combining all the adjusted signals into an aggregated signal; at least one hub (4) for distributing the aggregated signal to each of the computers via a coupled TV tuner respectively. Each of the computers is used for decoding various TV programs at different signal frequencies in an emulated TV channel, and generating a test report on the performance of each TV tuner. A related method is also disclosed.

13 Claims, 2 Drawing Sheets

SIMULATION SYSTEM AND METHOD FOR TESTING PERFORMANCES OF TV TUNERS

FIELD OF THE INVENTION

The present invention generally relates to the field of generating simulated television (TV) signals to test attached components of a computer, and more particularly to a TV signal simulation system and method for testing performances of TV tuners.

DESCRIPTION OF RELATED ART

It is generally understood that a television (TV) tuner is a computer peripheral component that enables receiving TV broadcast which allows watching television on a computer. The TV Tuner can be used to supply TV signals directly to the computer without connecting an external tuning equipment, such as a video compact disc (VCD) player, a digital video disc (DVD) player, or a video cassette recorder (VCR). There are two typical types of TV tuners: an external TV tuner and an internal TV tuner. The external TV tuner is configured outside the computer and attached to the computer, usually by a USB connection. The internal TV tuner is typically a PCI or a PCI Express card that is plugged into an internal slot of the computer's motherboard. Users of the computer can watch various TV programs on the computer by using the internal TV Tuner, and can also record or replay the scenes of the TV programs on the computer by using the external TV Tuner.

There are mainly three types of TV system standards used worldwide: National Television System Committee (NTSC), Phase Alternating Line (PAL), and Sequential Color and Memory System (SECAM). In general, different countries use a type of TV system standards incompatible with each other. In order to ensure the TV tuners adapts to different TV system standards, it is essential to simulate different types of TV signals to test the TV standard of the TV tuners produced by computer manufacturers.

Most computer manufactures use a traditional TV signal generator (i.e. type Fluke54200) for generating TV signals in order to test performance of TV tuners. The traditional TV signal generator can generates all types of TV signals that include NTSC signals, PAL signals, and SECAM signals. However, typical TV signal generators cannot simultaneously generated all three types of TV signals. In addition, they cannot support multiple TV tuner connections to perform test the TV tuner functions at the same time. Furthermore, it is very difficult to test all types of TV signals on a wide range broadcasting frequencies by means of utilizing the traditional TV signal generator.

What is needed, therefore, is a simulation system and method for testing performances of TV tuners that can simultaneously provide different types of emulated TV signals on various different broadcasting frequencies for testing the performances of various TV tuners. Thus, testers may not only test performances of the TV tuners on one TV channel, but also switch the TV channel to test the performance of the TV turners.

SUMMARY OF INVENTION

A simulation system for testing performances of TV tuners in accordance with a preferred embodiment at least includes a plurality of players, a plurality of frequency adjusters, at least one frequency mixer, at least one hub, and a plurality of computers each coupled with a TV tuner.

Each of the players is used for transmitting an original signal comprising audio and video data formatted in a corresponding data format. Each of the frequency adjusters is used for receiving a corresponding original signal from one of the players, and for changing the original signal into an adjusted signal having a fixed frequency. The frequency mixer is used for combining all the adjusted signals from the frequency adjusters into an aggregated signal. The hub is used for distributing the aggregated signal to each of the computers via a coupled TV tuner respectively. Each of the computers is used for decoding various TV programs at different signal frequencies in an emulated TV channel, and generating a test report on the performance of the TV tuner.

Another preferred embodiment provides a simulation method for testing performances of TV tuners by utilizing the above system. The method includes the steps of: (a) generating a type original of signal to corresponding frequency adjusters; (b) changing the original signal into an adjusted signal having a fixed frequency in each of the frequency adjusters, and sending the adjusted signal to a frequency mixer; (c) combining all of the adjusted signals from the frequency adjusters into one aggregated signal, and sending the aggregated signal to a hub; (d) distributing the aggregated signal to each computer via a coupled TV tuner respectively; (e) testing performance of each TV tuner by decoding the aggregated signal on different channels; and (f) generating a testing report on the performance of the TV tuner.

In summary, the simulation system and method for testing performances of TV tuners can simultaneously provide different types of standardized TV signals on various different signal frequencies for testing the performances of various TV tuners.

Other advantages and novel features of the embodiments will be drawn from the following detailed description with reference to the attached drawings, in which:

DETAILED DESCRIPTION

Figure 1:
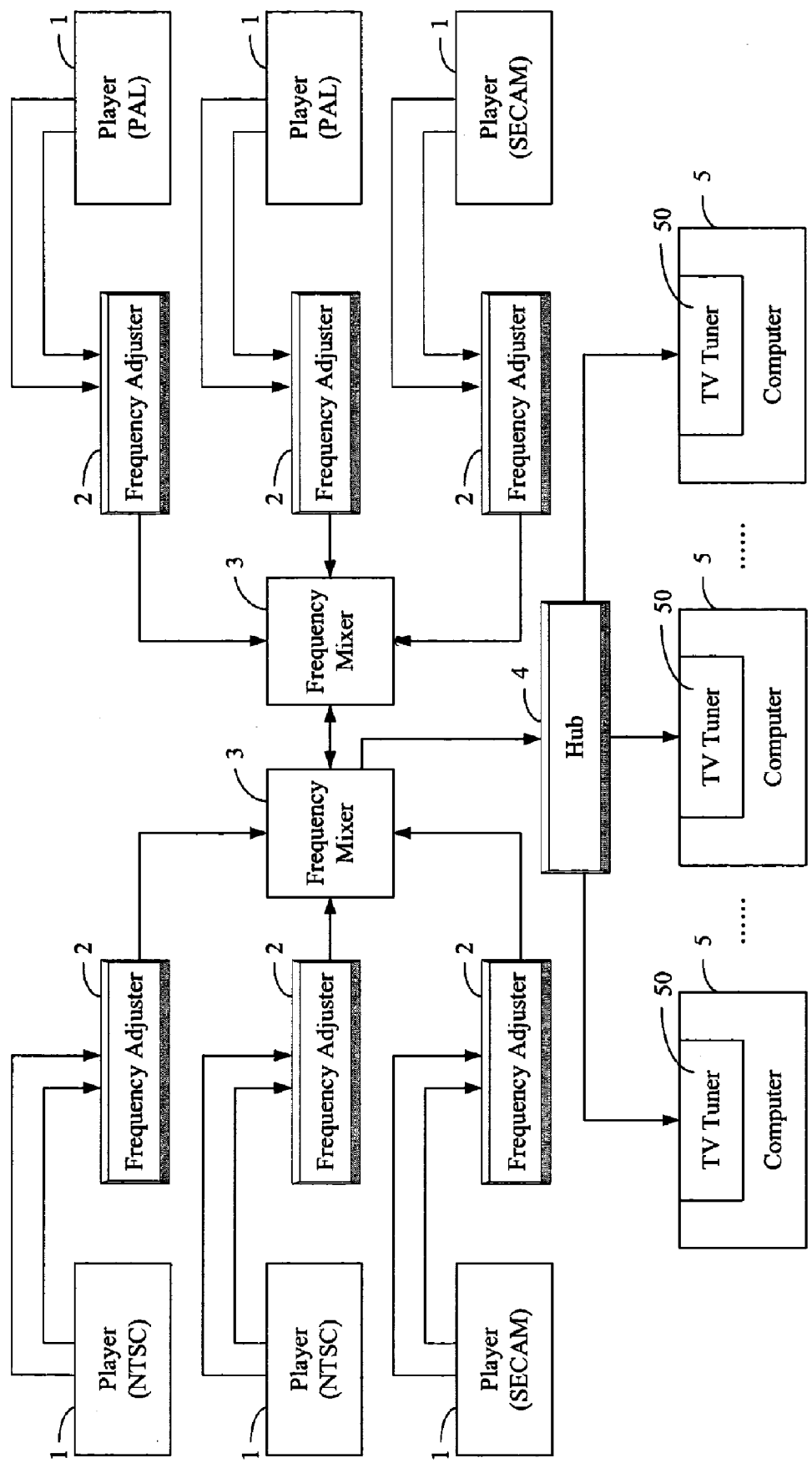
FIG. 1 is a schematic diagram of a simulation system for testing performances of TV tuners in accordance with a preferred embodiment.

FIG. 1 is a schematic diagram of a system for testing performances of television (TV) tuners (hereinafter "the system") in accordance with a preferred embodiment. The system includes a plurality of players 1, a plurality of frequency adjusters 2, at least one frequency mixer 3, at least one hub 4, and a plurality of computers 5 each coupled to a TV tuner 50. Each of the players 1 connects with a frequency adjuster 2 via an audio and video signal (AV) line. All of the frequency adjusters 2 connect to the frequency mixer 3, and the frequency mixer 3 connects to the hub 4. The hub 4 connects with all of the computers 5 coupled with a TV tuner 50.

The players 1 are typically selected from the group consisting of video compact disc (VCD) players, digital video disc (DVD) players, or any other suitable video players that can transmit an original signal that may consist of audio and video data formatted in either a National Television System Committee (NTSC) format, a Phase Alternating Line (PAL) format, or a Sequential Color and Memory System (SECAM) format. That is, each of the NTSC formatted players transmits the original signal consisting of audio and video data in the NTSC format. Each of the PAL formatted players transmits the original signal consisting of audio and video data in the PAL format. Each of the SECAM formatted players transmits the original signal consisting of audio and video data in the SECAM format.

Each of the frequency adjusters 2 is used for receiving a corresponding original signal from one of the players 2, and changing the original signal into an adjusted signal having a fixed frequency for simulating a TV signal receivable by the TV tuner 50, and also for sending the adjusted signal to a frequency mixer 3. The frequency mixer 3 is used for combining all of the adjusted signals received from the frequency adjusters 2 into an aggregated signal, and sending the aggregated signal to the hub 4. The hub 4 is used for distributing the aggregated signal to the computers 5 via its coupled TV tuners 50.

Each of the computers 5 is used for decoding various TV programs at different signal frequencies in an emulated TV channel environment, and also used for automatically generating a test report on the performance of each TV tuner 50. Each of the TV tuners 50 is used for simultaneously receiving different signals at various frequencies transmitted from the hub 4. The TV tuners 50 may be external TV tuners attached to the computers 5, or internal TV tuners plugged into internal slots that are located on the motherboard of the computers 5.

Figure 2:
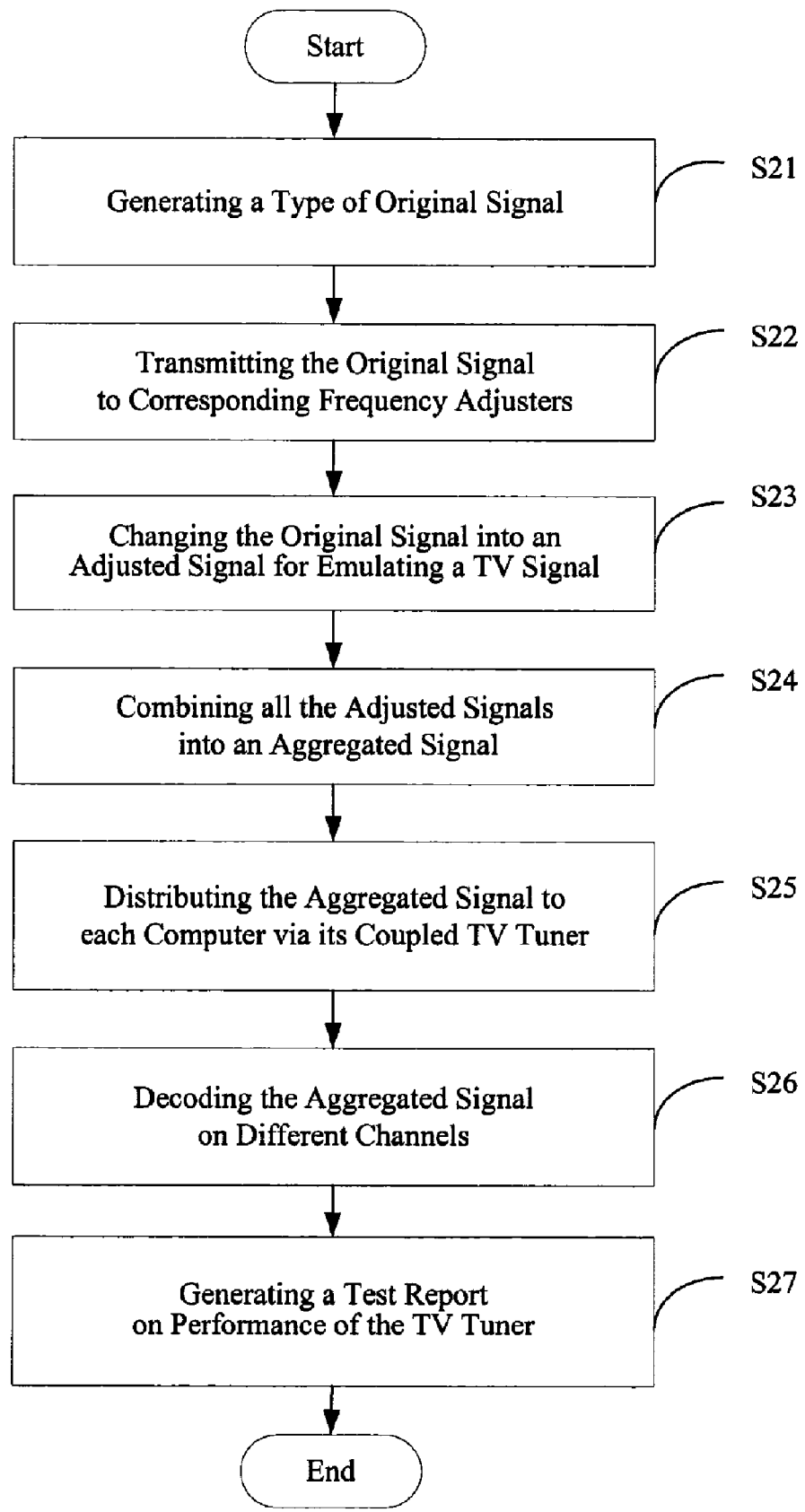
FIG. 2 is a flowchart of a preferred method for testing performances of TV tuners by implementing the system of FIG. 1.

FIG. 2 is a flowchart of a preferred method for generating TV signals to test performances of TV tuners 50 by implementing the system as described above.

In step S21, each of the players 1 generates an original signal that may consist of audio and video data formatted in either a PAL format, a NTST format, or a SECAM format. In step S22, each player 1 transmits the original signal to its corresponding frequency adjusters 2.

In step S23, in order to simulate a TV signal receivable by the TV tuner 50, each of the frequency adjusters 2 changes the original signal received from each of the players 1 into an adjusted signal having a fixed frequency, and sends the adjusted signal to the frequency mixer 3.

In step S24, the frequency mixer 3 combines all of the adjusted signals received from the frequency adjusters 2 into one aggregated signal, and sends the aggregated signal to the hub 4. The aggregated signal may include the combination of the adjusted signal consisting of audio and video data formatted in PAL, NTSC, or SECAM.

In step S25, the hub 4 distributes the aggregated signal to each computer 5 via its coupled TV tuner 50 respectively. In step S26, each of the computers 5 decodes the aggregated signal on different channels received from the hub 4 via the TV tuner 50. In step S27, each of the computers 5 simultaneously tests performance of the coupled TV tuner 50 by switching TV channels, and automatically generates a test report on the performance of each TV tuner 50.

According to the above-described system and method, testers may be able test performance of the TV tuners 50 by a range of receivable band of each channel or by switching preset TV channels.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

What is claimed is:

1. A simulation system for testing performances of television (TV) tuners attached to a plurality of computers, the simulation system comprising:
   a plurality of players, each for transmitting an original signal comprising audio and video data formatted in a corresponding data format;
   a plurality of frequency adjusters, each being connected to one of the players, for receiving a corresponding original signal from the player and changing the original signal into an adjusted signal having a fixed frequency;
   at least one frequency mixer connected to the frequency adjusters, for combining all the adjusted signals into an aggregated signal; and
   at least one hub connected to the frequency mixer, for distributing the aggregated signal to each of the computers via a coupled TV tuner respectively;
   wherein, each of the computers is used for decoding various TV programs at different signal frequencies in an emulated TV channel, and for generating a test report on the performance of the TV tuner.

2. The system according to claim 1, wherein the players are selected from a group consisting of National Television System Committee (NTSC) formatted players, Phase Alternating Line (PAL) formatted players, and/or Sequential Color and Memory System (SECAM) formatted players.

3. The system according to claim 2, wherein each of the NTSC formatted players is used for transmitting the original signal consisting of audio and video data in a NTSC format.

4. The system according to claim 2, wherein each of the PAL formatted players is used for transmitting the original signal consisting of audio and video data in a PAL format.

5. The system according to claim 2, wherein each of the SECAM formatted players is used for transmitting the original signal consisting of audio and video data in a SECAM format.

6. The system according to claim 1, wherein the players are selected from the group consisting of video compact disc (VCD) players, and/or digital video disc (DVD) players.

7. The system according to claim 1, wherein each of the TV tuners is used for respectively receiving the aggregated signal transmitted from the hub.

8. A simulation method for testing performances of television (TV) tuners attached to a plurality of computers, the method comprising the steps of:
   generating a type of original signal to corresponding frequency adjusters;
   changing the original signal into an adjusted signal having a fixed frequency in each of the frequency adjusters, and sending the adjusted signal to a frequency mixer;
   combining all the adjusted signals received from the frequency adjusters into one aggregated signal, and sending the aggregated signal to a hub;
   distributing the aggregated signal to each of the computers via a coupled TV tuner respectively;
   testing performance of each TV tuner by decoding the aggregated signal on different channels; and
   generating a testing report on the performance of the TV tuner.

9. The method according to claim 8, further comprising the step of switching different channels to test the performance of the TV tuner.

10. The method according to claim 8, wherein the original signal comprises audio and video data formatted in National Television System Committee (NTSC), Phase Alternating Line (PAL), or Sequential Color and Memory System (SECAM).

11. A simulation method for testing performances of television (TV) tuners attached to a plurality of computers, the method comprising the steps of:

simultaneously transmitting a plurality of original signals comprising audio and video data formatted in different data formats;

changing each of the original signals into an adjusted signal having a fixed frequency; combining all the adjusted signals into one aggregated signal;

distributing the aggregated signal to each of the computers via a coupled TV tuner respectively;

testing performance of the TV tuner by decoding the aggregated signal on different channels; and generating a testing report on the performance of the TV tuner.

12. The method according to claim 11, further comprising the step of switching different channels to test performances of the TV tuner.

13. The method according to claim 11, wherein the data formats comprise National Television System Committee (NTSC) formats, Phase Alternating Line (PAL) formats, and Sequential Color and Memory System (SECAM) formats.

* * * * *

UNITED STATES PATENT AND TRADEMARK OFFICE
CERTIFICATE OF CORRECTION

PATENT NO. : 7,639,276 B2  Page 1 of 1
APPLICATION NO. : 11/308759
DATED : December 29, 2009
INVENTOR(S) : Peng Zeng It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 915 days.

Signed and Sealed this

Ninth Day of November, 2010

David J. Kappos
*Director of the United States Patent and Trademark Office*